(12) United States Patent
Jeong et al.

(10) Patent No.: US 11,963,292 B2
(45) Date of Patent: Apr. 16, 2024

(54) PATTERNED COVER MEMBER AND ELECTRONIC DEVICE INCLUDING SAME

(71) Applicant: Samsung Electronics Co., Ltd., Suwon-si (KR)

(72) Inventors: Injo Jeong, Suwon-si (KR); Jeahyuck Lee, Suwon-si (KR); Hyunguk Yoo, Suwon-si (KR); Inho Yun, Suwon-si (KR); Seongwook Jo, Suwon-si (KR); Younghyun Kim, Suwon-si (KR); Eungi Min, Suwon-si (KR); Suho Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 294 days.

(21) Appl. No.: 17/406,535

(22) Filed: Aug. 19, 2021

(65) Prior Publication Data

US 2022/0087014 A1     Mar. 17, 2022

(30) Foreign Application Priority Data

Sep. 16, 2020   (KR) .................. 10-2020-0118883

(51) Int. Cl.
   *H05K 1/02*       (2006.01)
   *G04G 17/04*      (2006.01)
   (Continued)

(52) U.S. Cl.
   CPC .......... *H05K 1/0274* (2013.01); *G04G 17/04* (2013.01); *G04G 17/08* (2013.01); *G04G 17/06* (2013.01); *H05K 2201/10106* (2013.01)

(58) Field of Classification Search
   CPC ....... H05K 1/0274; H05K 2201/10106; G04G 17/04; G04G 17/08; G04G 17/06
   See application file for complete search history.

(56) References Cited

U.S. PATENT DOCUMENTS

| 8,749,522 B2 | 6/2014 | Dietzel et al. |
| 10,247,670 B2 | 4/2019 | Ness et al. |

(Continued)

FOREIGN PATENT DOCUMENTS

| JP | 08-252213 A | 10/1996 |
| JP | 2015/191093 A | 11/2015 |

(Continued)

OTHER PUBLICATIONS

International Search Report and written opinion dated Nov. 26, 2021, issued in International Application No. PCT/KR2021/011089.

(Continued)

*Primary Examiner* — Mary Ellen Bowman
(74) *Attorney, Agent, or Firm* — Jefferson IP Law, LLP

(57) ABSTRACT

An electronic device is provided. The electronic device includes a printed circuit board, a light emitting unit and a light receiving unit which are disposed on the printed circuit board, a cover member which has at least a partial region configured by a material having high optical transmittance, is disposed to face the printed circuit board, and includes a first region substantially facing the light emitting unit, and a second region substantially facing the light receiving unit, and a pattern disposed in at least one of the first region and the second region of the cover member. The pattern may be disposed by repeatedly arranging blocking units having low transmittance at a predetermined interval. In addition, various embodiments may be possible.

20 Claims, 14 Drawing Sheets

(51) Int. Cl.
*G04G 17/06* (2006.01)
*G04G 17/08* (2006.01)

(56) References Cited

U.S. PATENT DOCUMENTS

| | | | |
|---|---|---|---|
| 2004/0081025 A1* | 4/2004 | Chen | G04G 21/00 |
| | | | 368/10 |
| 2013/0135972 A1* | 5/2013 | Nakamura | G04G 21/02 |
| | | | 368/11 |
| 2015/0301257 A1 | 10/2015 | Choi et al. | |
| 2015/0340351 A1 | 11/2015 | Rossi et al. | |
| 2015/0366068 A1* | 12/2015 | Zhang | H05K 3/0023 |
| | | | 29/847 |
| 2017/0220844 A1 | 8/2017 | Jones et al. | |
| 2018/0136480 A1 | 5/2018 | Shimano | |
| 2019/0069848 A1 | 3/2019 | Clavelle et al. | |
| 2019/0110697 A1 | 4/2019 | Oode et al. | |
| 2021/0072101 A1 | 3/2021 | Kato et al. | |

FOREIGN PATENT DOCUMENTS

| | | |
|---|---|---|
| JP | 2018-165639 A | 10/2018 |
| JP | 2019-093078 A | 6/2019 |
| JP | 6962474 B2 | 11/2021 |
| KR | 10-2008-0113154 A | 12/2008 |
| KR | 10-2009-0025794 A | 3/2009 |
| KR | 10-2014-0060215 A | 5/2014 |
| KR | 10-2442045 B1 | 9/2022 |
| WO | 2014/109711 A1 | 7/2014 |

OTHER PUBLICATIONS

European Search Report dated Nov. 13, 2023; European Appln No. 21869562.5-1001/4167845 PCT/KR2021011089.

* cited by examiner

| H [μm] | W [μm] | P [μm] | Cut-off angle [°] |
|---|---|---|---|
| 33 | 15 | 24 | 58 |
| 45 | 20 | 28 | 47 |

641

(a)

PATTERNED COVER MEMBER AND ELECTRONIC DEVICE INCLUDING SAME

CROSS-REFERENCE TO RELATED APPLICATION(S)

This application is based on and claims priority under 35 U.S.C. § 119(a) of a Korean patent application number 10-2020-0118883, filed on Sep. 16, 2020, in the Korean Intellectual Property Office, the disclosure of which is incorporated by reference herein in its entirety.

BACKGROUND

1. Field

The disclosure relates to a patterned cover member and an electronic device including the same.

2. Description of Related Art

In line with increased interest in good health, electronic devices are equipped with functions for measuring users' biometric information. For example, wearable electronic devices are equipped with various sensors capable of measuring users' biometric information.

A wearable electronic device may be equipped with a sensor capable of measuring information related to the user's heartbeat. Such a sensor may measure heartbeat-related information by using a change in the optical transmittance of a blood vessel resulting from a change in the amount of bloodstream.

There has been extensive research/development for improving the measurement precision of such a sensor.

The above information is presented as background information only to assist with an understanding of the disclosure. No determination has been made, and no assertion is made, as to whether any of the above might be applicable as prior art with regard to the disclosure.

SUMMARY

Major factors that degrade the measurement precision of a sensor configured to measure heartbeat-related information by using a changed in the optical transmittance of a blood vessel resulting from a change in the amount of bloodstream include inflow of ambient light.

Ideal heartbeat information measurement requires that light emitted by a light emitter and reflected by the user's skin is solely received by a light receiver. However, in actual measurement situations, ambient light (for example, sunlight, fluorescent light) other than light from the light emitter may be received by the light receiver.

Ambient light may act as noise in connection with heartbeat-related information measurement. There has been attempts to apply mathematical algorithms in connection with incident ambient light such that the influence thereof is reduced, but reducing incident ambient light per se will be the most important solution.

Aspects of the disclosure are to address at least the above-mentioned problems and/or disadvantages and to provide at least the advantages described below. Accordingly, an aspect of the disclosure is to provide a patterned cover member capable of reducing the amount of ambient light flowing into the light receiver, and an electronic device including the cover member.

Additional aspects will be set forth in part in the description which follows and, in part, will be apparent from the description, or may be learned by practice of the presented embodiments.

In accordance with an aspect of the disclosure, an electronic device is provided. The electronic device includes a printed circuit board, a light emitting unit and a light receiving unit which are disposed on the printed circuit board, a cover member which has at least a partial region configured by a material having high optical transmittance, is disposed to face the printed circuit board, and includes a first region substantially facing the light emitting unit, and a second region substantially facing the light receiving unit, and a pattern disposed in at least one of the first region and the second region of the cover member, wherein at least a portion of the pattern is configured by a first material having low optical transmittance, and wherein the pattern is disposed by repeatedly arranging blocking units having low optical transmittance at a predetermined interval.

In accordance with another aspect of the disclosure, a cover member of an electronic device is provided. The cover member of an electronic device includes a first surface facing a printed circuit board, a second surface opposite to the first surface, a first region substantially facing a light emitting unit configured to generate light, a second region substantially facing a light receiving unit configured to convert light into an electrical signal, and a pattern disposed in at least one of the first region and the second region of at least one of the first surface and the second surface by repeatedly arranging blocking units having low optical transmittance at a predetermined interval.

According to various embodiments disclosed herein, the amount of ambient light flowing into the light receiver is reduced during a heartbeat-related information measuring operation, and a configured quality of heartbeat-related information can thus be measured.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and its advantages of certain embodiments of the disclosure will be more apparent from the following description taken in conjunction with the accompanying drawings, in which.

The same reference numerals are used to represent the same elements throughout the drawings.

DETAILED DESCRIPTION

Figure 1:
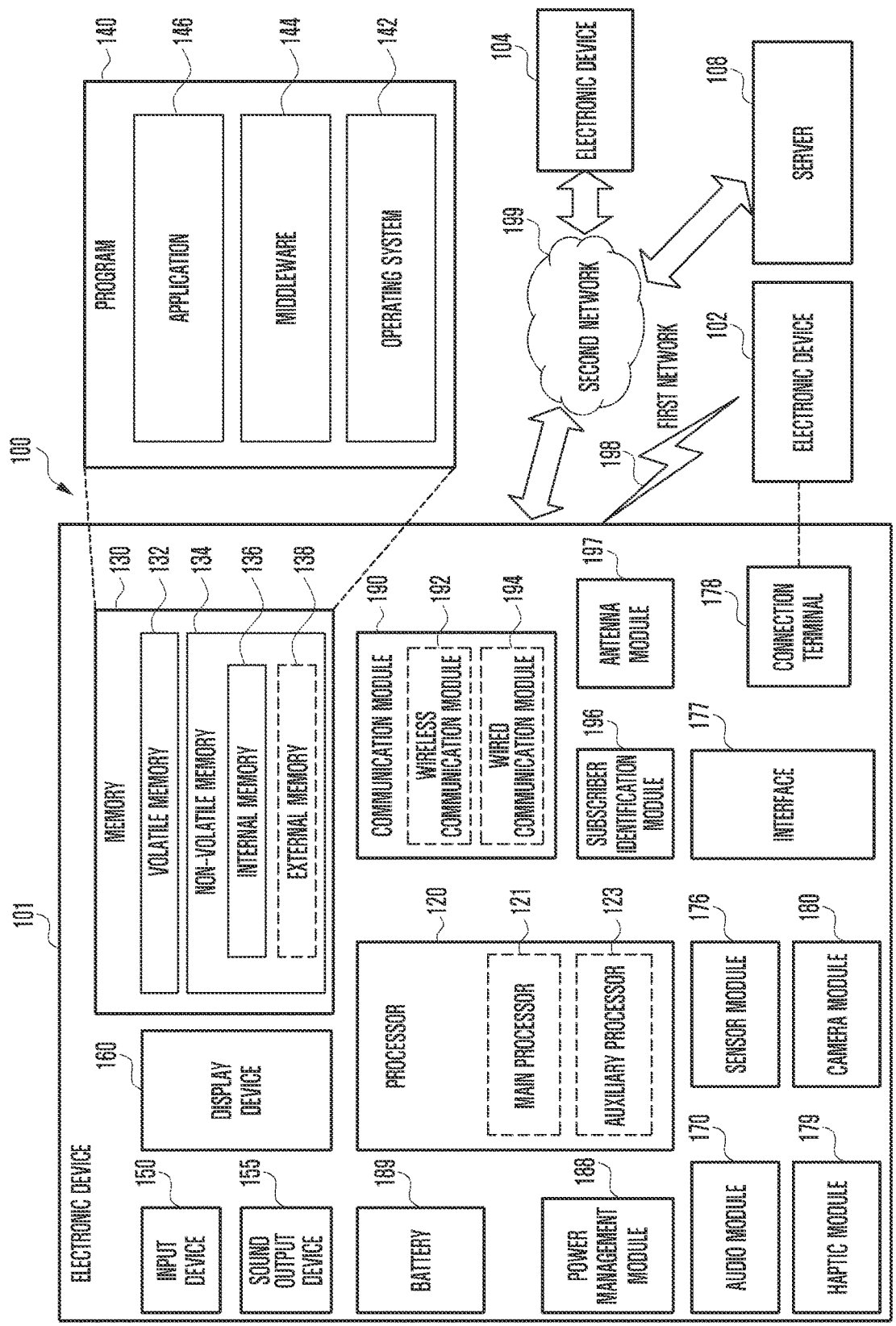
FIG. 1 is a block diagram of an electronic device in a network environment according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

It should be appreciated that various embodiments of the disclosure and the terms used therein are not intended to limit the technological features set forth herein to particular embodiments and include various changes, equivalents, or replacements for a corresponding embodiment.

With regard to the description of the drawings, similar reference numerals may be used to refer to similar or related elements. It is to be understood that a singular form of a noun corresponding to an item may include one or more of the things, unless the relevant context clearly indicates otherwise.

As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order).

It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

FIG. 1 is a block diagram illustrating an electronic device 101 in a network environment 100 according to an embodiment of the disclosure. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134. The non-volatile memory 134 includes an internal memory 136 and may include an external memory 138.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™ wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
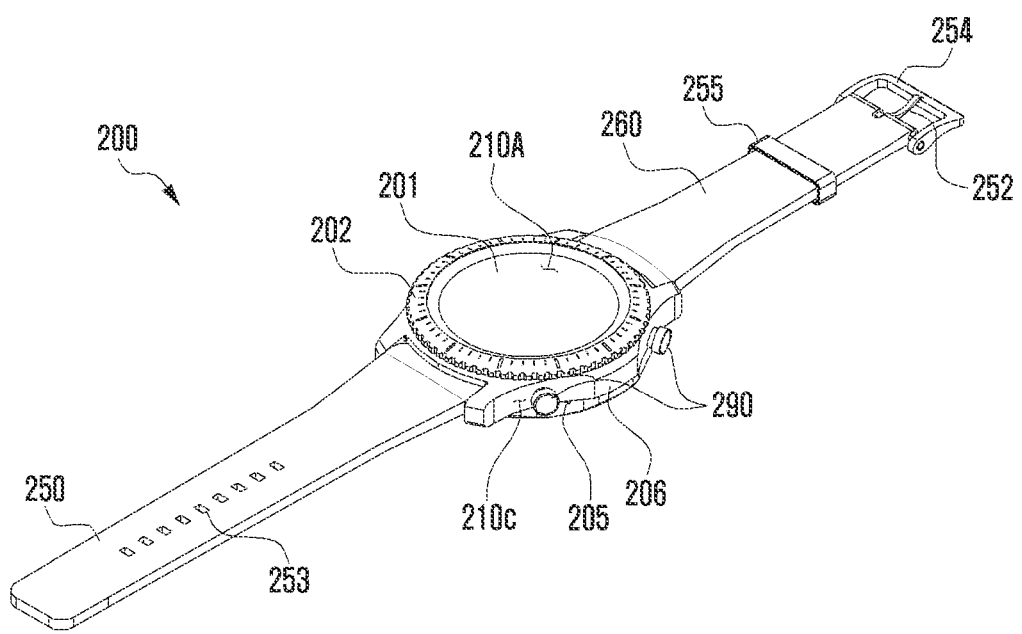
FIG. 2 is a front perspective view of a mobile electronic device according to an embodiment of the disclosure.
Figure 3:
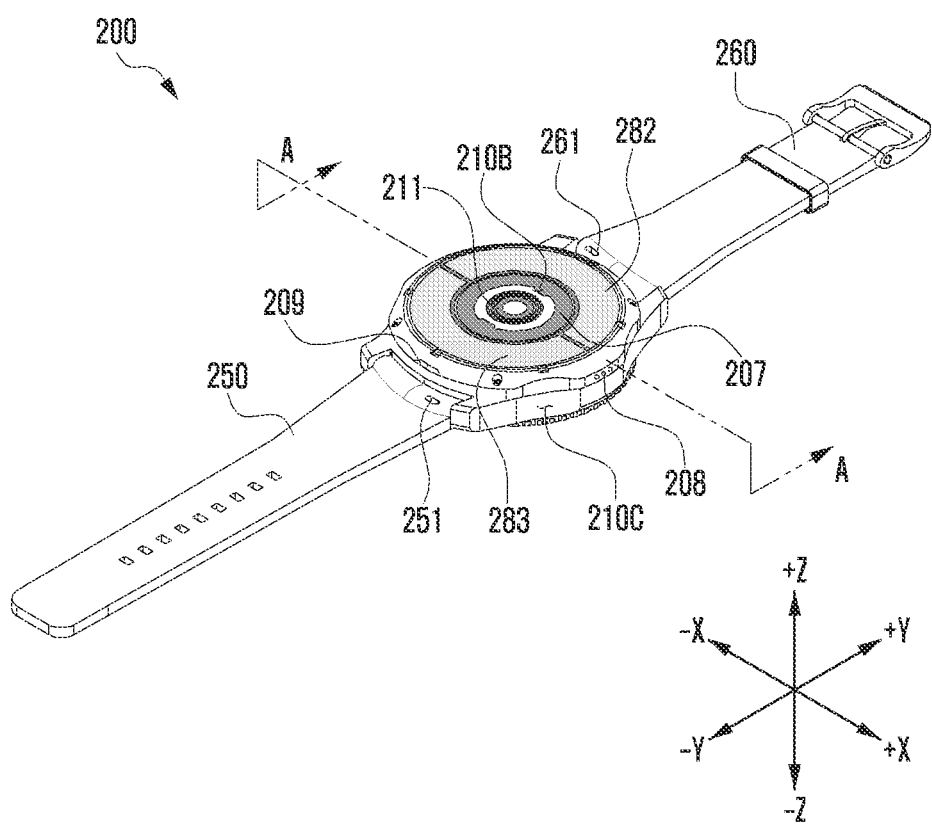
FIG. 3 is a rear perspective view of the electronic device of FIG. 2 according to an embodiment of the disclosure.
Figure 4:
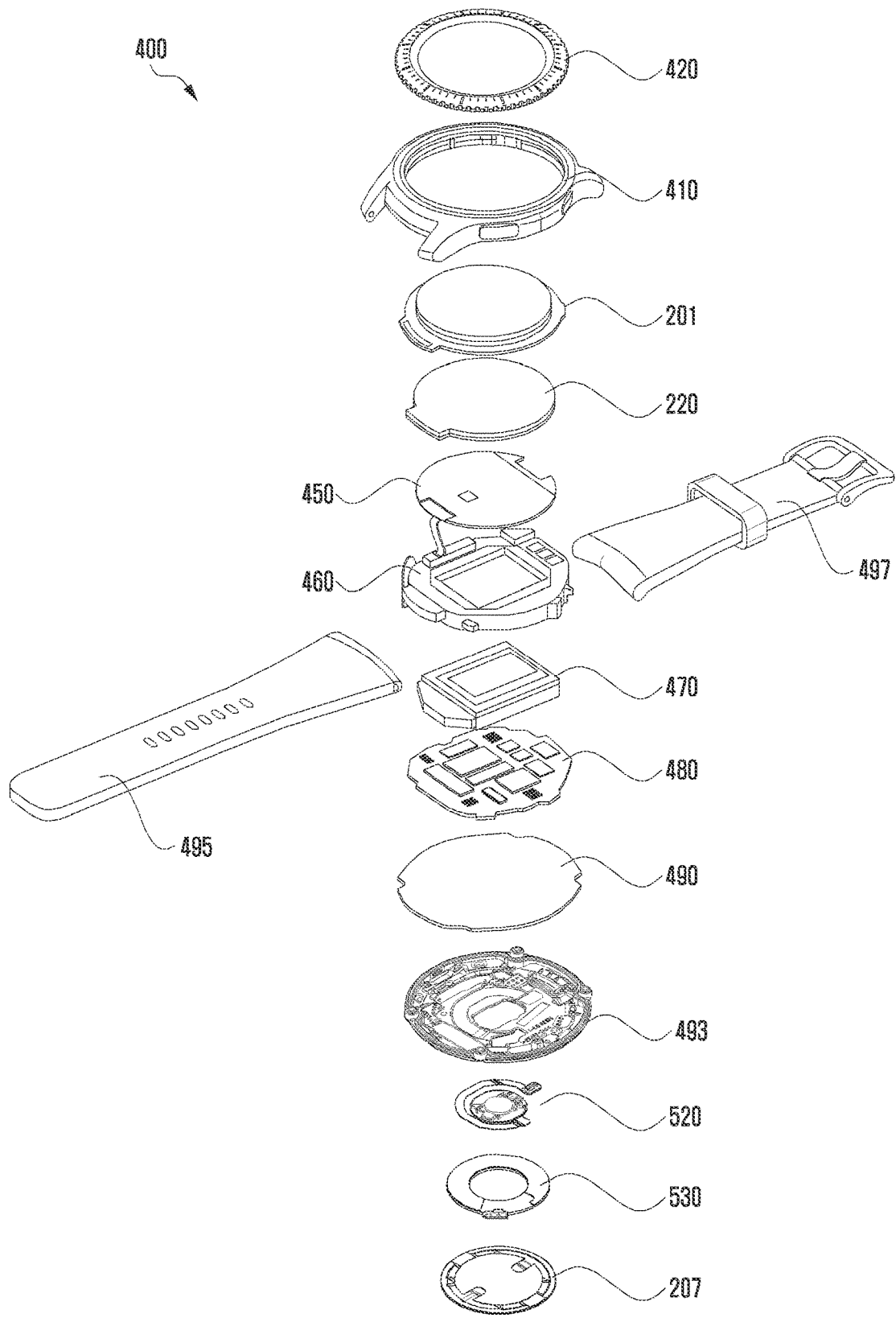
FIG. 4 is an exploded perspective view of the electronic device of FIG. 2 according to an embodiment of the disclosure.

FIG. 2 is a front perspective view of a mobile electronic device according to an embodiment of the disclosure. FIG. 3 is a rear perspective view of the electronic device of FIG. 2 according to an embodiment of the disclosure. FIG. 4 is an exploded perspective view of the electronic device of FIG. 2 according to an embodiment of the disclosure.

Referring to FIGS. 2 and 3, an electronic device 200 (e.g., the electronic device 101 of FIG. 1) according to one embodiment may include: a housing 210 including a first surface 210A (or front surface), a second surface 210B (or rear surface), and a side surface 210C surrounding a space between the first surface 210A and the second surface 210B; and binding members 250 and 260 each connected to at least a portion of the housing 210 and configured to allow the electronic device 200 to be detachably bound to a part of a user's body (e.g., wrist, ankle, etc.). In another embodiment (not shown), a structure configuring a portion of the first surface 210A, the second surface 210B, and the side surfaces 210C, which are shown in FIG. 2, may be referred to as a housing. According to one embodiment, the first surface 210A may be formed by a front plate 201 (e.g., a polymer plate or a glass plate including various coating layers) having at least a portion which is substantially transparent. The second surface 210B may be formed by a rear cover 207 which is substantially opaque. The rear cover 207 is formed by, for example, coated or colored glass, a ceramic, a polymer, a metal (e.g., aluminum, stainless steel (STS), or magnesium), or a combination of at least two thereof. The side surface 210C may be formed by a side bezel structure 206 (or "side surface member") that is coupled to the front plate 201 and the rear cover 207 and includes a metal and/or a polymer. In an embodiment, the rear cover 207 and the side bezel structure 206 may be integrally formed and include the same material (e.g., a metal material such as aluminum). The binding members 250 and 260 may include various materials and shapes. The binding members 250 and 260 may be formed as an integral unit link and a plurality of unit links by fabric, leather, rubber, urethane, a metal, a ceramic, or a combination of at least two thereof such that the same can move with regard to each other.

According to one embodiment, electrodes 282 and 283 formed of a conductive material may be formed in one region of the rear cover 207 of the electronic device 200. The electrodes 282 and 283 may be in contact with the user's skin when the electronic device 200 is worn. The electrodes 282 and 283 formed on the rear cover 207 may be electrodes for measuring a user's bioelectrical signal. For example, electrocardiogram-related biometric information may be measured using the electrodes 282 and 283.

According to one embodiment, the electronic device 200 may include at least one of a display 220 (see FIG. 4), audio modules 205 and 208, a sensor module 211, key input devices 202 and 290, and a connector hole 209. According to an embodiment, at least one of the elements (e.g., the key input device 202 and 290, the connector hole 209, or the sensor module 211) may be omitted from the electronic device 200 or another element may be further added to the electronic device 200.

The display 220, for example, may be exposed through a substantial portion of the front plate 201. The shape of the display 220 may be a shape corresponding to the shape of the front plate 201 and may have various shapes, such as a circle, an oval, or a polygon. The display 220 may be connected to or disposed adjacent to a touch sensing circuit, a pressure sensor capable of measuring the intensity (pressure) of a touch, and/or a fingerprint sensor.

The audio modules 205 and 208 may include a microphone hole 205 and a speaker hole 208. A microphone for acquiring external sound may be disposed inside the microphone hole 205, and in an embodiment, a plurality of microphones may be arranged inside thereof so as to sense the direction of sound. The speaker hole 208 may be used as an external speaker and a call receiver. In an embodiment, the speaker hole 208 and the microphone hole 205 may be implemented by one hole, or a speaker may be provided without the speaker hole 208 (e.g., piezo speaker).

The sensor module 211 may generate an electrical signal or a data value corresponding to an internal operating state or an external environmental state of the electronic device 200. The sensor module 211 may include, for example, a biometric sensor module 211 (e.g., heart rate monitor (HRM) sensor) disposed on the second surface 210B of the housing 210. The electronic device 200 may further include a sensor module which is not shown, for example, at least one of a gesture sensor, a gyro sensor, a barometric pressure sensor, a magnetic sensor, an acceleration sensor, a grip sensor, a color sensor, an infrared (IR) sensor, a biometric sensor, a temperature sensor, a humidity sensor, or an illuminance sensor.

The key input devices 202 and 290 may include a wheel key 202 which is disposed on the first surface 210A of the housing 210 and is rotatable in at least one direction, and/or a side key button 290 disposed on the side surface 210C of the housing 210. The wheel key may have a shape corresponding to the shape of the front plate 201. In another embodiment, the electronic device 200 may not include some or all of the above-mentioned key input devices 202 and 290, and the key input devices 202 and 290 which are not included may be implemented in other forms, such as a soft key, on the display 220. The connector hole 209 may include another connector hole (not shown) capable of accommodating a connector (e.g., USB connector) for transmitting and receiving power and/or data to and from an external electronic device and accommodating a connector for transmitting and receiving an audio signal to and from an external electronic device. The electronic device 200 may further include, for example, a connector cover (not shown) that covers at least a portion of the connector hole 209 and blocks the inflow of foreign substances into the connector hole.

The binding members 250 and 260 may be detachably attached to at least a partial region of the housing 210 by using locking members 251 and 261. The binding members 250 and 260 may include one or more of a fixing member 252, a fixing member fastening hole 253, a band guide member 254, and a band fixing ring 255.

The fixing member 252 may be configured to fix the housing 210 and the binding members 250 and 260 to a part (e.g., wrist, ankle, etc.) of the user's body. The fixing member fastening hole 253 may fix the housing 210 and the binding members 250 and 260 to a part of the user's body to correspond to the fixing member 252. The band guide member 254 is configured to limit the range of movement of the fixing member 252 when the fixing member 252 is fastened with the fixing member fastening hole 253 so that the binding members 250 and 260 are brought into close contact with a part of the user's body to be bound thereto. The band fixing ring 255 may limit the range of movement of the binding members 250 and 260 in a state in which the fixing member 252 and the fixing member fastening hole 253 are fastened to each other.

Referring to FIG. 4, an electronic device 400 may include a side bezel structure 410, a wheel key 420, a front plate 201, a display 220, a first antenna 450, a support member 460 (e.g., bracket), a battery 470, a first printed circuit board 480, a sealing member 490, a rear plate 493, and binding members 495 and 497. At least one of the elements of the electronic device 400 may be the same as or similar to at least one of the elements of the electronic device 200 of FIG. 2 or 3 and overlapping description thereof will be omitted. The support member 460 may be disposed inside the electronic device 400 and connected to the side bezel structure 410, or may be integrally formed with the side bezel structure 410. The support member 460 may be formed of, for example, a metal material and/or a non-metal (e.g., polymer) material. One surface of the support member 460 may be coupled to a display 220 and the other surface thereof may be coupled to the first printed circuit board 480. The first printed circuit board 480 may be equipped with a processor, a memory, and/or an interface. The processor may include, for example, one or more of a central processing unit, an application processor, a graphic processing unit (GPU), a sensor processor, or a communication processor.

The memory may include, for example, a volatile memory or a non-volatile memory. The interface may include, for example, a high definition multimedia interface (HDMI), a universal serial bus (USB) interface, an SD card interface, and/or an audio interface. The interface may, for example, electrically or physically connect the electronic device 400 to an external electronic device, and may include a USB connector, an SD card/MMC connector, or an audio connector.

The battery 470 is a device for supplying power to at least one component of the electronic device 400 and may include, for example, a non-rechargeable primary battery, a rechargeable secondary battery, or a fuel cell. At least a portion of the battery 470 may be, for example, disposed substantially on the same plane as the first printed circuit board 480. The battery 470 may be disposed integrally inside the electronic device 200, or may be disposed to be attached to and detached from the electronic device 200.

The first antenna 450 may be disposed between the display 220 and the support member 460. The first antenna 450 may include, for example, a near field communication (NFC) antenna, a wireless charging antenna, and/or a magnetic secure transmission (MST) antenna. The first antenna 450 may, for example, perform short-range communication with an external device or wirelessly transmit/receive power required for charging, and may transmit a magnetic-based signal including a short-range communication signal or payment data. In another embodiment, the antenna structure may be formed by a part of the side bezel structure 410 and/or the support member 460 or a combination thereof.

The sealing member 490 may be positioned between the side bezel structure 410 and the rear plate 493. The sealing member 490 may be configured to block moisture and foreign substances from flowing into the space surrounded by the side bezel structure 410 and the rear plate 493 from the outside.

A second printed circuit board 520 (e.g., printed circuit board (PCB), flexible printed circuit board (FPCB), or rigid-flexible PCB (RFPCB)) and a wirelessly charging coil 530 may be disposed between the rear plate 493 and the rear cover 207. The second printed circuit board 520 may be electrically connected to the first printed circuit board 480 through a hole formed through the rear plate 493. The wireless charging coil 530 may be disposed to surround the outer periphery of the second printed circuit board 520.

According to various embodiments, the electronic device disclosed herein may be a wearable electronic device that can be worn on a user's body. For example, as shown in FIGS. 2 to 4, the electronic device disclosed herein may include a wrist watch type electronic device that can be worn on a user's wrist.

Figure 5:
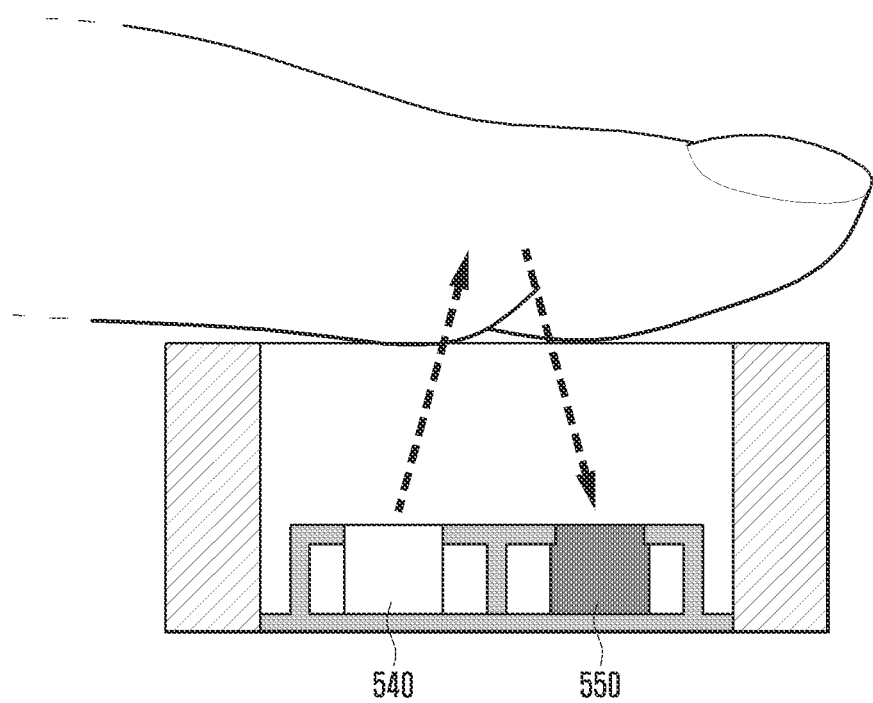
FIG. 5 explains a principle of measuring heart rate-related information by using a light emitting unit and a light receiving unit according to an embodiment of the disclosure.

FIG. 5 explains a principle of measuring heart rate-related information by using a light emitting unit 540 and a light receiving unit 550 according to an embodiment of the disclosure.

Referring to FIG. 5, the electronic device (e.g., the electronic device 101 of FIG. 1 or the electronic device 200 of FIGS. 2 to 3) may include the light emitting unit 540 and the light receiving unit 550.

According to various embodiments, the electronic device may include a biometric sensor module (e.g., the biometric sensor module 211 of FIG. 3) including the light emitting unit 540 and the light receiving unit 550. The light emitting unit 540 and the light receiving unit 550 may be components of a sensor that measures heartbeat-related information (e.g., heart rate) by detecting optical transmittance of the blood vessels changing according to the contraction and relaxation of the blood vessels by heartbeats. For example, the biometric sensor module 211 may be disposed on the second surface (e.g., the second surface 210B of FIG. 3) of the housing 210 of the electronic device. The light emitting unit 540 may include at least one light emitting element that converts electrical energy into light energy. For example, the light emitting unit 540 may emit a signal (e.g., green light, red light, infrared light, etc.) to an external object (e.g., user's skin). The light emitting element may include, for example, at least one of a light emitting diode (LED), an organic light emitting diode (OLED), a solid laser, an infrared (IR) diode, or an injection laser diode (ILD). The light receiving unit 550 may include at least one light receiving element that converts light energy into electrical energy. For example, the light receiving unit 550 may convert bio-signal data in the form of an optical signal into an electrical signal form. The light receiving element may include, for example, at least one of a photo diode (PD), an avalanche photo diode (APD), a phototransistor, and an image sensor. In addition, various light emitting elements and light receiving elements that can be employed by those skilled in the art without particular difficulty may be included in the light emitting unit 540 and the light receiving unit 550 of various embodiments disclosed herein, respectively.

According to various embodiments, the electronic device disclosed herein may measure heart rate-related information of a user wearing the electronic device, by using the light emitting unit 540 and the light receiving unit 550. The light emitting unit 540 and the light receiving unit 550 may be used for photoplethysmography (PPG), which is a method of measuring a user's heart rate by using light.

Photoplethysmography is a heart rate measurement method using optical transmittance of artery. When the heart beats, the artery may be dilated, and the blood flow of the artery may be changed by the dilation of the artery. The arterial optical transmittance may change due to changes in the arterial blood flow. Photoplethysmography is a heart rate measurement method using the optical transmittance of the artery, which changes according to a change in blood flow in the artery due to heartbeats.

A portion of the light generated by the light emitting unit 540 may pass through the artery and a portion thereof may be reflected from the artery. The light receiving unit 550 may detect the amount of light reflected from the artery. Since the change in the electrical signal measured by the light receiving unit 550 is related to the change in the blood flow in the artery, and the change in the blood flow in the artery is made by the heartbeat, the electronic device according to various embodiments disclosed herein may measure the heart rate information from the electrical signal measured by the light receiving unit 550.

Figure 6:
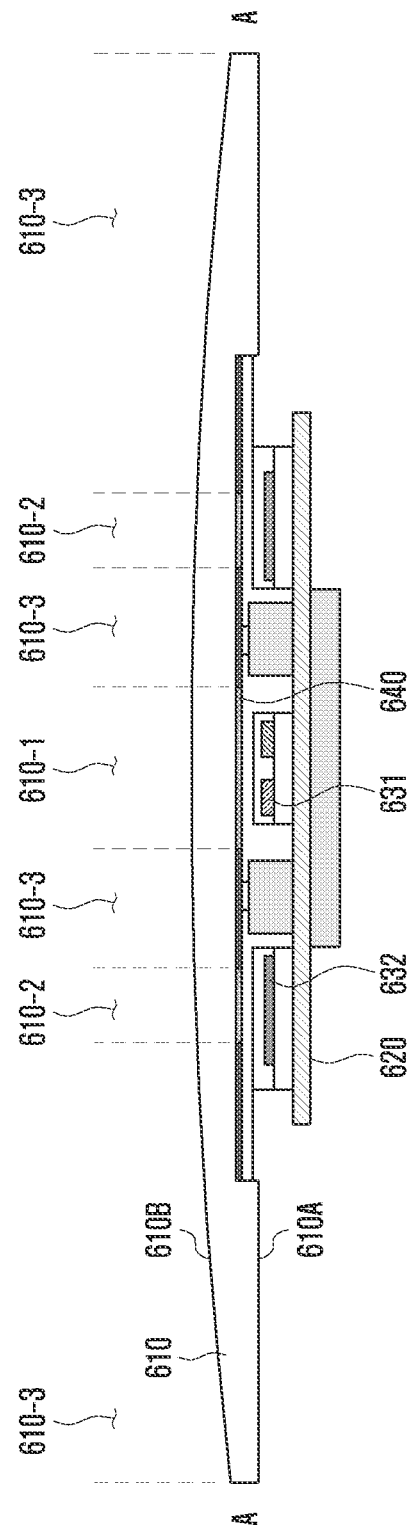
FIG. 6 is a partial sectional view of the electronic device illustrated in FIG. 3, taken along line A-A according to an embodiment of the disclosure.

FIG. 6 is a partial sectional view of the electronic device 200 illustrated in FIG. 3, taken along line A-A according to an embodiment of the disclosure. FIG. 6 is a partial sectional view of the electronic device 200 shown in FIG. 3, taken along the line A-A and viewed from the +Y direction or the −Y direction.

According to various embodiments disclosed herein, a light emitting unit 631 (e.g., the light emitting unit 540 of FIG. 5) and a light receiving unit 632 (e.g., the light receiving unit 550 of FIG. 5) may be disposed on a printed circuit board 620 (e.g., the second printed circuit board 520 of FIG. 4) included in the electronic device (e.g., the electronic device 101 of FIG. 1 or the electronic device 200 of FIGS. 2 to 3) to be electrically connected to the printed circuit board 620. The light emitting unit 631 and the light receiving unit 632 may be disposed on the printed circuit board 620 (e.g., the second printed circuit board 520 of FIG. 4) adjacent to a cover member 610 (e.g., the rear cover 207 of FIG. 4) forming the outer surface of the electronic device, among a plurality of printed circuit boards (e.g., the first printed circuit board 480 and the second printed circuit board 520 of FIG. 4) which may be included in the electronic device.

Referring to FIG. 6, a plurality of light receiving units 632 may be provided and arranged around the light emitting unit 631 (e.g., the outer periphery of the light emitting unit 631). Light generated from the light emitting unit 631 may be diffusely reflected by the user's skin. Light incident to a plurality of points from various directions may be received through the plurality of light receiving units 632 disposed around the light emitting unit 631. Accordingly, the electronic device may acquire desired quality data. As used herein, the desired quality data may refer to an expectation quality or a preconfigured quality with respect to an electrical signal detected through the plurality of light receiving units 632 according to the specification (e.g., intensity and wavelength of light emitted from the light emitting unit, and resolution of the light receiving unit) and arrangement of the plurality of light receiving units 632 and the light emitting unit 631. As used herein, the quality may be quantitatively evaluated through, for example, a signal-to-noise ratio (SNR).

According to various embodiments, the cover member 610 may be disposed at a position where the cover member substantially faces the printed circuit board 620 on which the light emitting unit 631 and the light receiving units 632 are disposed. The cover member 610 may have at least a partial region formed of a material having high optical transmittance. For example, the cover member 610 may be formed of a glass or a transparent polymer material. Since the cover member 610 constitutes the outer surface of the electronic device, the cover member 610 may be formed of a material having excellent durability. The cover member 610 may be formed of a material having excellent strength, hardness, or corrosion resistance.

According to various embodiments, the cover member 610 may include a first surface 610A substantially facing the printed circuit board 620, and a second surface 610B opposite to the first surface 610A. The cover member 610 may include a first region 610-1 substantially facing the light emitting unit 631, a second region 610-2 substantially facing the light receiving units 632, and a third region 610-3 other than the first region 610-1 and the second region 610-2. In one embodiment, a material having low optical transmittance may be disposed in at least a portion of the third region 610-3 so that the inside of the electronic device is not seen through the third region 610-3. In one embodiment, the first region 610-1 and the second region 610-2 may be regions that are relatively closer to the center of the cover member 610 than the third region 610-3. The first region 610-1 may be a region substantially facing the light emitting unit 631, and may be smaller or larger than the area occupied by the light emitting unit 631. The second region 610-2 may be a region substantially facing the light receiving units 632, and may be smaller or larger than the area occupied by the light receiving units 632. The area of the cover member 610 described above is only a conceptual division for convenience of description, and the area of the cover member 610 may not be visually divided.

According to various embodiments, a pattern 640 may be formed on at least a partial region of the cover member 610. According to one embodiment, as shown in FIG. 6, the pattern 640 may be formed on at least a partial region of the first surface 610A of the cover member 610. The pattern 640 formed on the first surface 610A of the cover member 610 may be used for blocking light other than the light which is incident when the light generated from the light emitting unit 631 is reflected by the user's skin, from being incident to the light receiving units 632. For example, the pattern 640 may block light around the electronic device from being incident to the light receiving units 632 of the electronic device. Light around the electronic device may act as noise in measuring heart rate information. The electronic device may not acquire biometric signal data (e.g., heart rate information) having a predetermined quality due to the inflow of ambient light. The pattern 640 formed on the cover member 610 according to various embodiments disclosed herein may block light around the electronic device from being incident to the light receiving units 632 to enable the heart rate measurement to be performed with a desired quality.

When a separate film having the pattern 640 formed thereon is attached to the cover member 610, light generated from the light emitting unit 631 may be refracted or reflected at the film or an interface between the film and the cover member 610. The refracted or reflected light may be incident to the light receiving units 632. Since the pattern 640 according to various embodiments disclosed herein is directly formed on the cover member 610, the above problem can be solved. In addition, since a separate film is not used in the electronic device, the electronic device may have excellent durability, a lower unit cost, and a reduced thickness.

Figure 7A:
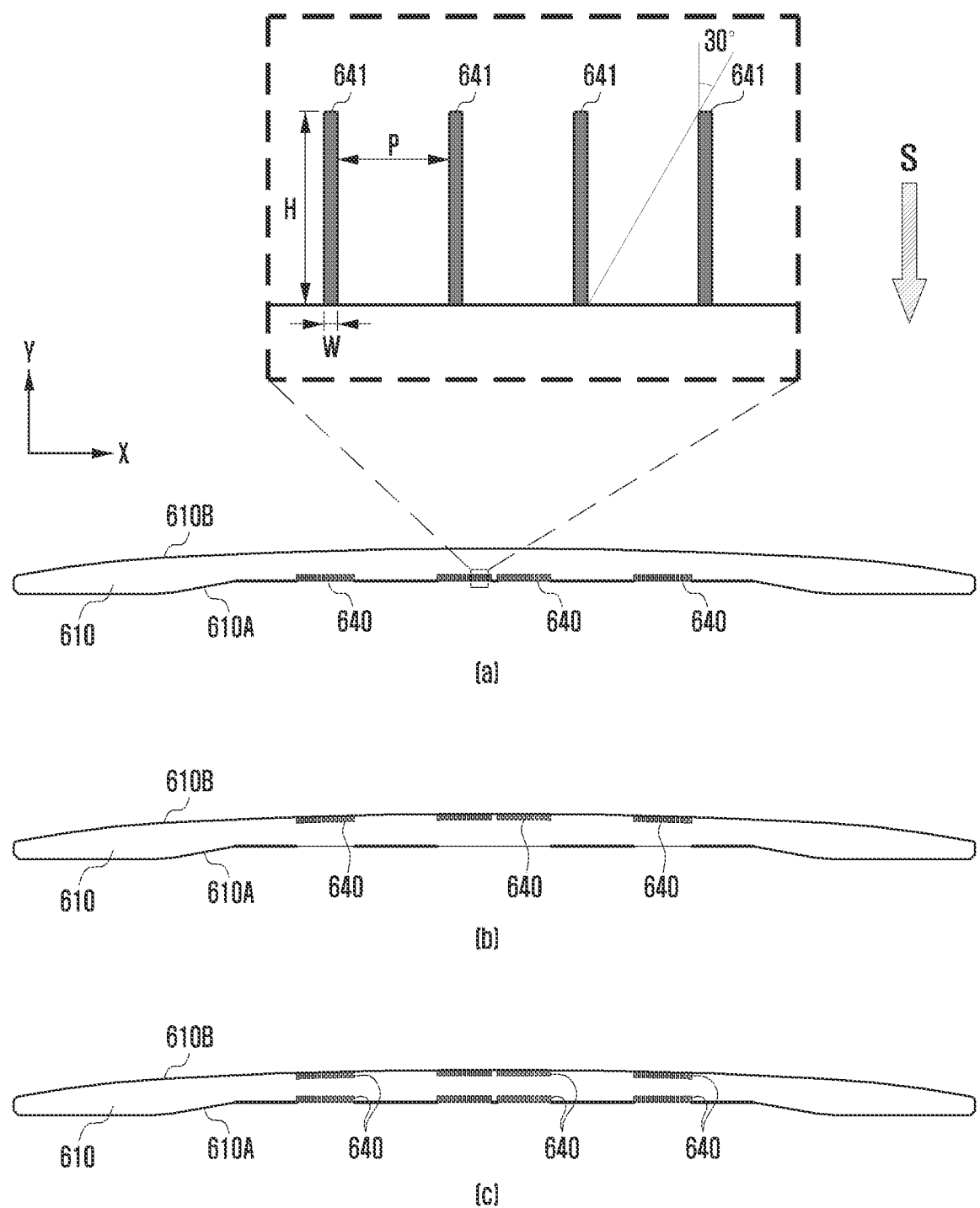
FIG. 7A explains a pattern formed on a cover member according to an embodiment of the disclosure.
Figure 8:
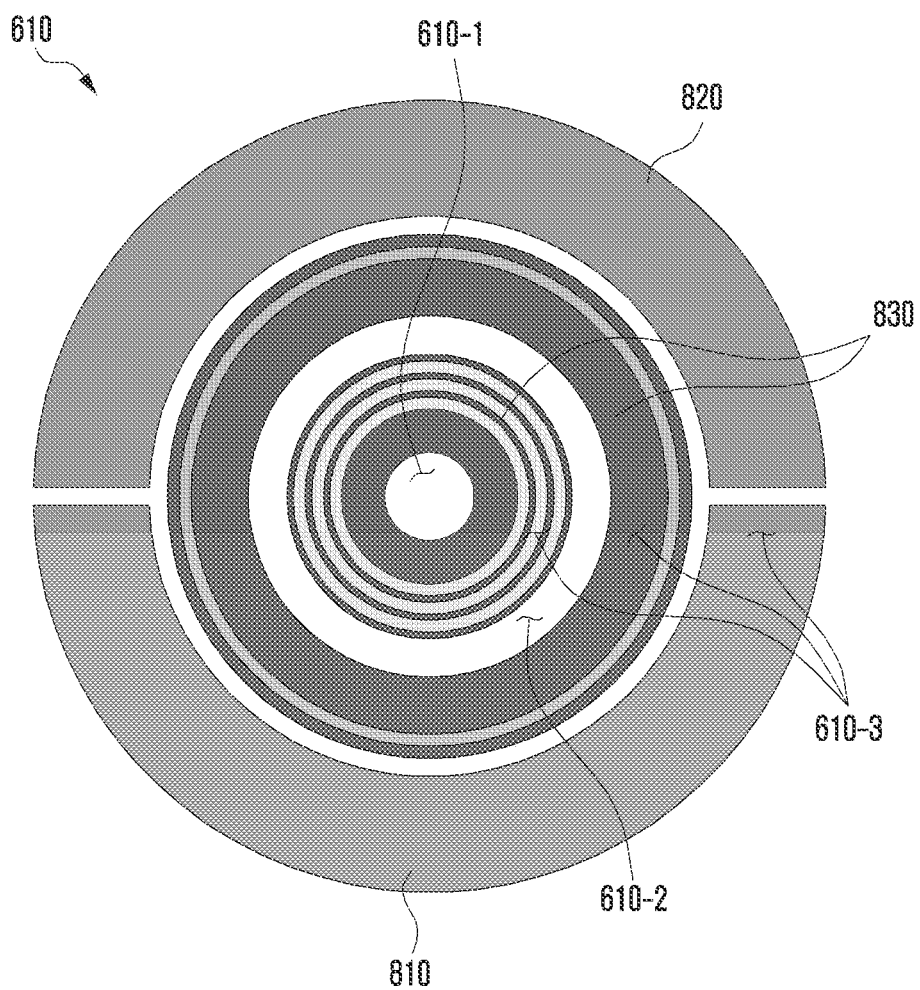
FIG. 8 is a plan view of the cover member viewed from the S direction, which is illustrated in FIG. 7A according to an embodiment of the disclosure.

FIG. 7A explains the pattern 640 formed on the cover member 610 according to an embodiment of the disclosure. FIG. 8 is a plan view of the cover member 610 viewed from the S direction, which is illustrated in FIG. 7A according to an embodiment of the disclosure.

According to various embodiments, the pattern 640 may be formed by repeatedly arranging blocking units 641 having low optical transmittance (or a high light absorption rate) at a predetermined interval (P). Hereinafter, the description that the transmittance is low may be understood by being replaced with the description that the absorption rate is high. The blocking units 641 may be formed of, for example, a black-based ink containing carbon. The black-based ink containing carbon may refer to an ink including a polymer resin containing a carbon-based substance (e.g., carbon black, ketjenblack, carbon nano tubes (CNT)). The black-based ink containing carbon may include silicon (Si) or silicon oxide ($SiO_2$) as an additive. In addition, the blocking units 641 may be formed of a material containing antimony triselenide and copper phthalate, and may be formed of a polymer resin containing cadmium (Cd) ions or copper (Cu) ions. The pattern 640 may be formed on the cover member 610 in various ways. For example, the pattern 640 may be formed by engraving a portion where the blocking units 641 are to be disposed and filling the engraved portion with a material having low transmittance. A description related to the formation of the pattern 640 will be described in more detail in the description in FIGS. 10A and 10B.

According to various embodiments, the height (H) and the width (W) of each of the blocking units 641 or the interval (P) therebetween, which are included in the pattern 640, may be configured in consideration of an angle of light incident to the cover member 610. As used herein, the height (H) of the blocking unit 641 may refer to a length from the surface (e.g., the first surface 610A or the second surface 610B) of the cover member 610 to a point where the blocking unit 641 ends. The width (W) may refer to a width of the blocking unit 641. Based on FIG. 7A, the height (H) of the blocking unit 641 may refer to a Y-axis direction length of the blocking unit 641, and the width (W) of the blocking unit 641 is an X-axis direction length of the blocking unit 641. The interval (P) between the blocking units 641 may refer to a length between adjacent blocking units 641. In one embodiment, the pattern 640 may have a height (H) and an interval (P) configured to block light having an incident angle of 30° or more with respect to the surface of the cover member 610. Referring to FIG. 7A, when a ratio of the height (H) of the blocking units 641 to the interval (P) therebetween is tan 30, the inflow of light having an incident angle of 30° may be blocked. For example, assuming that the interval (P) between the blocking units 641 is about 60 um, the height (H) may be determined to about 102 um which is 60 um*tan 30.

According to various embodiments, the blocking units 641 may have a height (H) of about 20 um to about 100 um and a width (W) of about 10 um to about 30 um, and the blocking units 641 may be repeatedly arranged at an interval (P) of about 20 um to about 100 um.

According to various embodiments, the pattern 640 may be formed on at least one of the first surface 610A and the second surface 610B of the cover member 610. For example, as illustrated in (a) of FIG. 7A, the pattern 640 may be formed on the first surface 610A of the cover member 610, which substantially faces the printed circuit board (e.g., the printed circuit board 620 of FIG. 6). As illustrated in (b) of FIG. 7A, the pattern 640 may be formed on the second surface 610B that is opposite to the first surface 610A. As illustrated in (c) of FIG. 7A, the pattern 640 may be formed on both the first surface 610A and the second surface 610B.

According to various embodiments, the pattern 640 may be formed in at least one of the first region 610-1 and the second region 610-2 of the cover member 610. For example, the pattern 640 may be formed in the first region 610-1 and the second region 610-2 of the cover member 610.

Referring to FIG. 8, a material 830 having low transmittance may be disposed in the third region 610-3 except for the first region 610-1 and the second region 610-2 of the cover member 610. According to one embodiment, electrodes 810 and 820 (e.g., the electrodes 282 and 283 of FIG. 3) formed of a material having low transmittance may be disposed in at least one region of the third region 610-3. According to one embodiment, the electrodes 810 and 820 may be the electrodes 810 and 820 for measuring an electrocardiogram signal. For example, the electrodes 810 and 820 may be made of a material capable of inducing total reflection. According to one embodiment, the material 830 or the electrodes 810 and 820 having low transmittance may be disposed in the third region 610-3 of the second surface 610B of the cover member 610. The material 830 or the electrodes 810 and 820 having low transmittance may be disposed in the third region 610-3 by a method such as printing, coating, or deposition. The phenomenon in which external light is incident to the light receiving units 632 may be reduced by arranging the electrodes 810 and 820 or the material 830 having low transmittance in the third region 610-3 except for the first region 610-1 substantially facing the light emitting unit 631 and the second region 610-2 substantially facing the light receiving units 632.

According to various embodiments, the second surface 610B of the cover member 610 may have high flatness. The second surface 610B of the cover member 610 may be a portion in contact with the user's skin when the electronic device is worn. When the flatness of the second surface 610B is increased, a contact area between the user's skin and the second surface 610B may increase. As the contact area between the user's skin and the second surface 610B is increased, a phenomenon in which external light is introduced into the light receiving units 632 may be reduced. In one embodiment, at least one of an anti-reflection material or an anti-scratch material may be disposed on the second surface 610B of the cover member 610. The anti-reflection material and the anti-scratch material may improve optical transmittance of the cover member 610. The improved optical transmittance may increase a ratio at which the light generated by the light emitting unit 631 is transmitted to the skin and a light ratio at which the light reflected by the skin is incident to the light receiving units 632. For example, the anti-reflection material and the anti-scratch material may be attached in the form of a film to the second surface 610B.

Figure 7B:
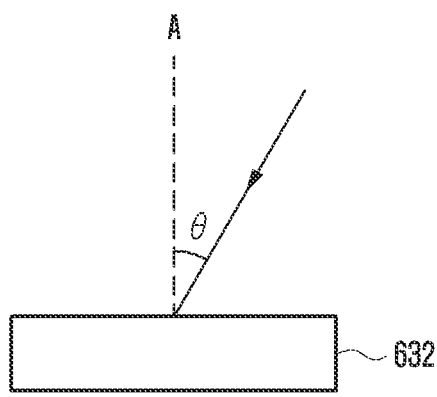
FIG. 7B explains data obtained by experimentally verifying effects according to a shape of blocking units of a pattern according to an embodiment of the disclosure.
Figure 7C:
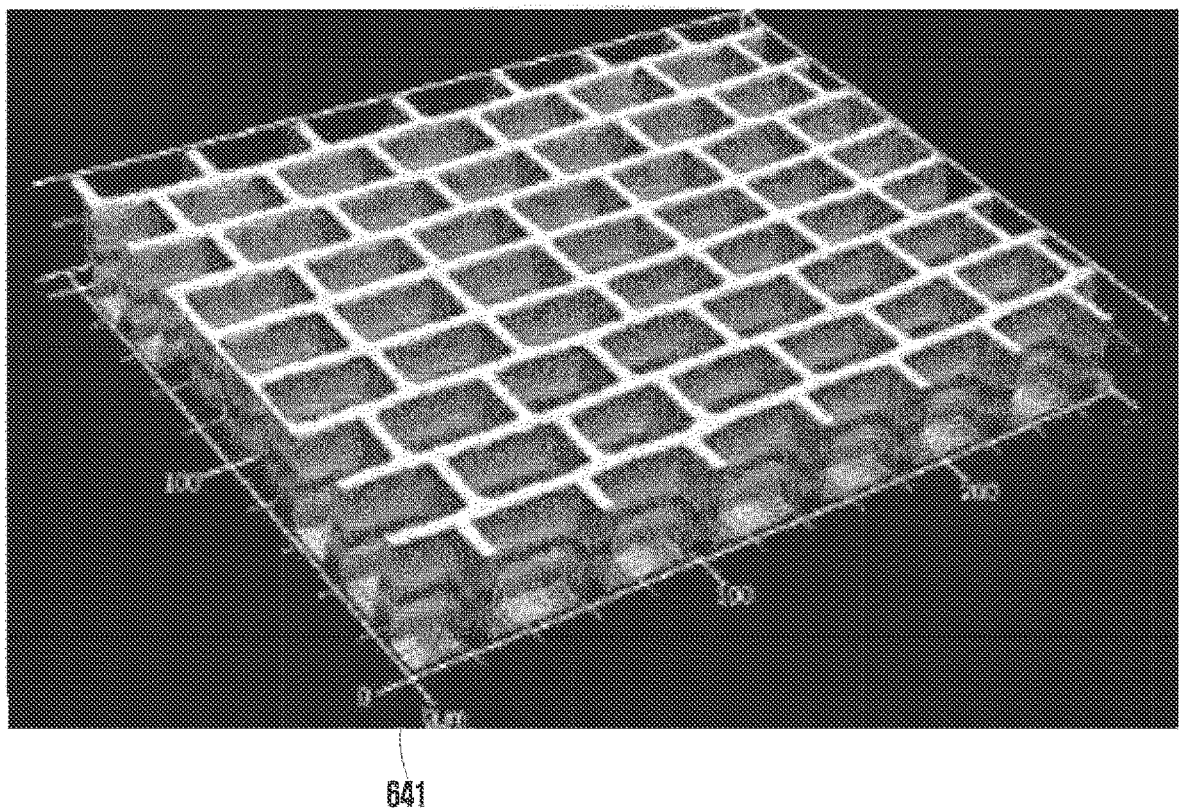
FIG. 7C shows an image of a pattern according to an embodiment of the disclosure.

FIG. 7B explains data obtained by experimentally verifying effects according to a shape of a blocking units of a pattern according to an embodiment of the disclosure. FIG. 7C shows an image of a pattern according to an embodiment of the disclosure.

The blocking unit 641 included in the pattern 640 may reduce a phenomenon in which external light is incident to the light receiving units 632. The blocking unit 641 may block light incident at an angle equal to or greater than a cut-off angle with respect to the light receiving units 632. As used herein, the cut-off angle may refer to an angle θ between the direction A in which the light receiving unit 632 faces and the light incident to the light receiving units 632. For example, when the cut-off angle is about 30°, the blocking unit 641 can block external light incident at about 30° or greater with respect to the light receiving units 632, and when the cut-off angle is about 60°, the blocking unit 641 may block external light incident at an angle of about 60° or greater with respect to the light receiving units 632.

Referring to FIG. 7B, when the height (H) of the blocking unit 641 is about 33 um, the width (W) thereof is about 15 um, and the interval (P) between the blocking units 641 is about 24 um, the cut-off angle may be about 58°. In this case, the blocking unit 641 may block a phenomenon in which external light incident at an angle exceeding about 58° with respect to the light receiving units 632 is incident to the light receiving units 632. In addition, when the height (H) of the blocking unit 641 is about 45 um, the width (W) thereof is about 20 um, and the interval (P) between the blocking units 641 is about 28 um, the cut-off angle may be about 47°. In this case, the blocking unit 641 may block a phenomenon in which external light incident at an angle exceeding about 47° with respect to the light receiving units 632 is incident to the light receiving units 632.

Referring to FIG. 7C, the blocking units 641 may be formed in the form of a lattice.

Figure 9A:
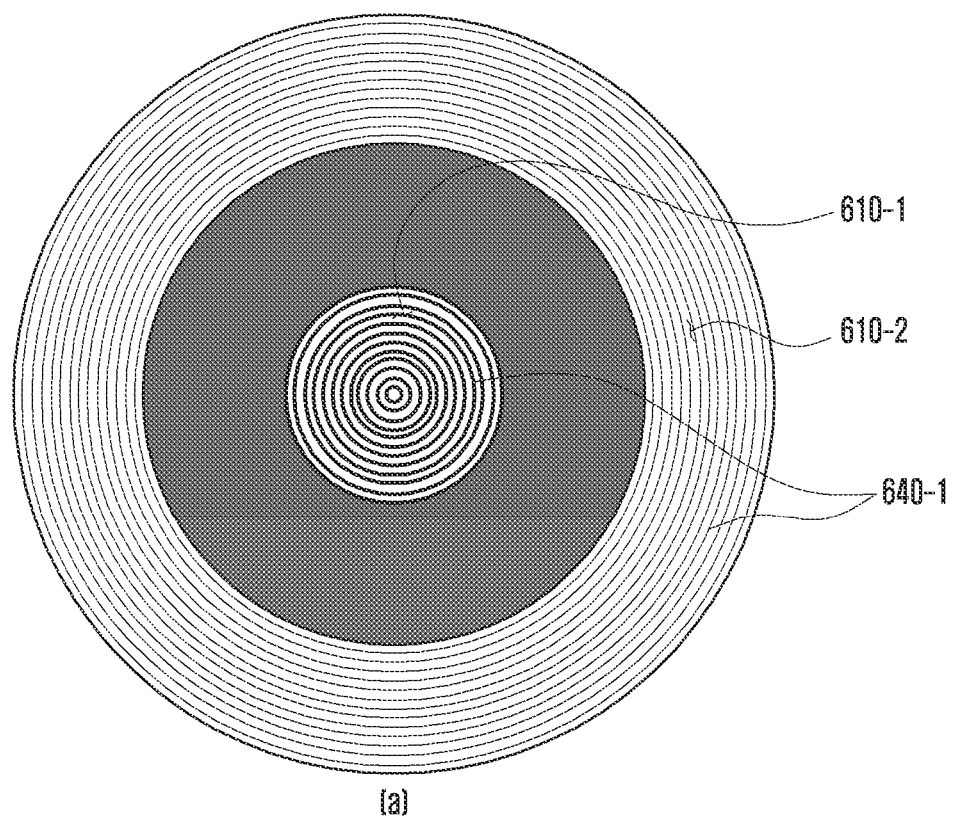
FIGS. 9A and 9B explain a shape of a pattern according to an embodiment of the disclosure.
Figure 9B:
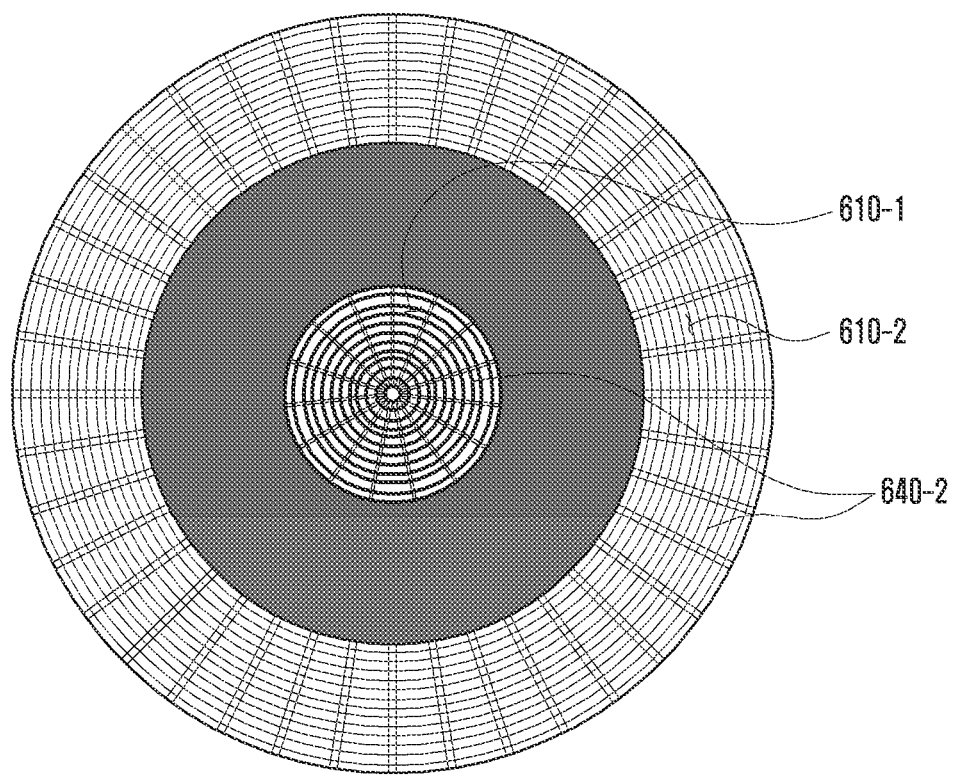

FIGS. 9A and 9B explain a shape of the pattern 640 according to an embodiment of the disclosure.

According to various embodiments, a pattern 640-1 formed on the cover member 610 may be formed in the first region 610-1 and the second region 610-2 of the cover member 610 while having a shape of concentric circles having different diameters. Referring to FIG. 9A, the pattern 640-1 may be formed in the first region 610-1 and the second region 610-2 while having a shape of concentric circles sharing the center of the cover member 610 and having different diameters.

According to various embodiments, the pattern formed on the cover member 610 may further include a shape formed by radiation from the center of the cover member 610 to the outer periphery of the cover member 610. For example, as shown in FIG. 9B, the pattern 640-2 may be formed by adding a pattern of a radial shape to a pattern of concentric circle shape.

The shapes of the patterns 640-1 and 640-2 shown in FIGS. 9A and 9B are only examples, and the shape of the pattern may be variously changed, in addition thereto. For example, although FIG. 9B illustrates the pattern 640-2 including a concentric circle shape and a radial shape at the same time, the pattern may only have a radiating shape. In addition, the pattern may have a polygonal shape.

Figure 10A:
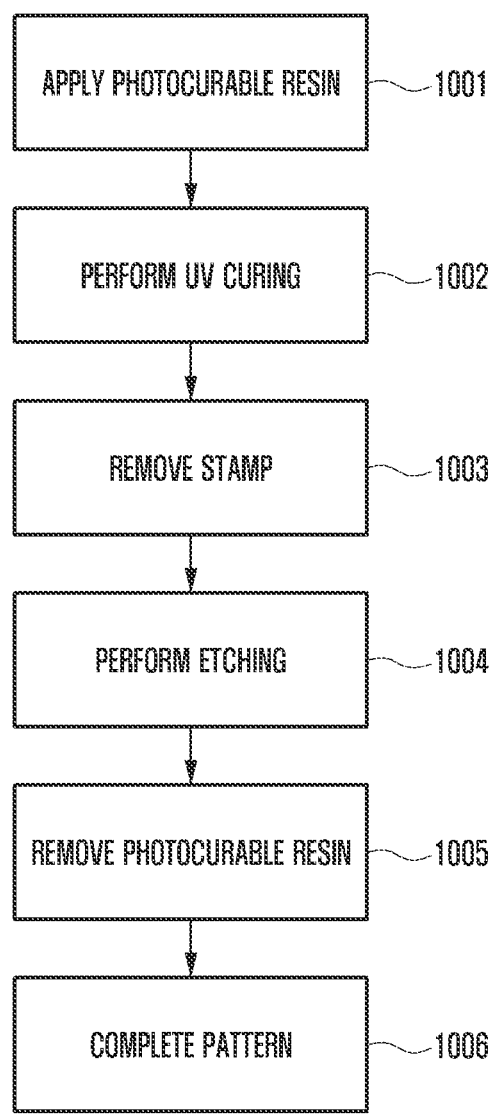
FIG. 10A is a flowchart of a method for forming a pattern on a cover member according to an embodiment of the disclosure.
Figure 10B:
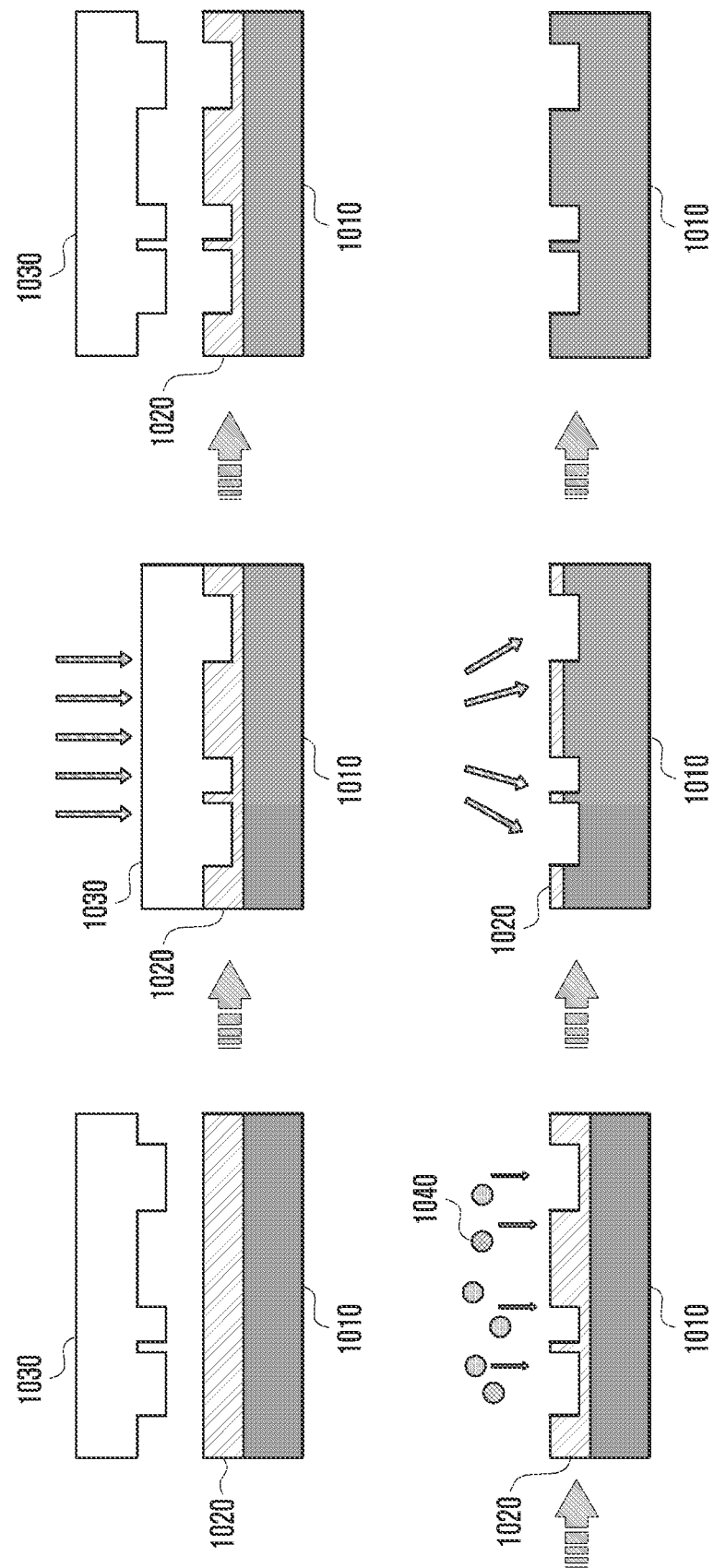
FIG. 10B explains a method for forming a pattern on a cover member according to an embodiment of the disclosure.

FIG. 10A is a flowchart of a method for forming a pattern on a cover member according to an embodiment of the disclosure. FIG. 10B explains a method of forming a pattern on a cover member according to an embodiment of the disclosure.

According to various embodiments, a pattern (e.g., the pattern 640 of FIG. 7A) may be formed on the cover member 1010 (e.g., the cover member 610 of FIG. 7A) in various manners. Hereinafter, a method for forming a pattern on the cover member 1010 by using a photocurable resin (ultra-violet (UV) resin) 1020 as a mask will be described with reference to FIGS. 10A and 10B. This method for forming a pattern is merely an example, and the method for forming a pattern of the cover member 1010 according to various embodiments disclosed herein is not limited to the forming method described below.

According to various embodiments, the photocurable resin 1020 may be applied to the cover member 1010 in operation 1001. In operation 1002, ultraviolet rays may be irradiated after a stamp 1030 having an embossing pattern is pressed onto the photocurable resin 1020 applied to the cover member 1010. An intaglio pattern may be formed on the photocurable resin 1020 by the stamp 1030, and the photocurable resin 1020 may be cured by UV irradiation. After the stamp 1030 is removed in operation 1003, etching may be performed in operation 1004. For example, the etching may be performed using a dry etching method using ions 1040. In this operation, the photocurable resin 1020 may be partially etched and the cover member 1010 may also be partially etched at the intaglio portion of the photo-curable resin 1020. Next, the photocurable resin 1020 may be removed in operation 1005. As a result, an intaglio pattern may be formed on the cover member 1010 in operation 1006.

As described above, the pattern may be completed by filling blocking units (e.g., the blocking units 641 of FIG. 7A) in intaglio portions of the cover member 1010. Filling with blocking units may be achieved by a method such as printing (e.g., screen printing or pad printing), deposition (e.g., sputtering deposition or chemical vapor deposition), or coating (e.g., spin coating or wet coating such as spraying).

An electronic device according to various embodiments disclosed herein includes a printed circuit board, a light emitting unit and a light receiving unit which are disposed on the printed circuit board, a cover member which has at least a partial region formed of a material having high optical transmittance, is disposed to face the printed circuit board, and includes a first region substantially facing the light emitting unit, and a second region substantially facing the light receiving unit, and a pattern formed in at least one of the first region and the second region of the cover member. At least a portion of the pattern is configured by a first material having low optical transmittance, and the pattern may be formed by repeatedly arranging blocking units having low optical transmittance at a predetermined interval.

The cover member may include a first surface facing the printed circuit board, and a second surface opposite to the first surface. The pattern may be formed on at least one of the first surface and the second surface of the printed circuit board.

The blocking units of the pattern may have a height of 20 um to 100 um and a width of 10 um to 30 um and may be arranged at an interval of 20 um to 100 um.

The pattern may have a shape of concentric circles sharing the center of the cover member and having different diameters.

The pattern may have a shape formed by radiation from the center of the cover member to the outer periphery of the cover member.

A plurality of light receiving units may be provided to be arranged along an outer periphery of the light emitting unit.

The second surface of the cover member may have high flatness so as to be in close contact with the user's skin.

At least one of an anti-reflection material and an anti-scratch material may be disposed on the second surface of the cover member to increase optical transmittance thereof.

The cover member may include a third region other than the first region and the second region, and a second material having low optical transmittance may disposed on the third region.

An electrode having low optical transmittance may be disposed in at least one region of the third region on the second surface of the cover member.

The blocking units of the pattern may be formed by forming intaglios on a surface of the cover member and filling portions of the intaglios with the first material having low optical transmittance.

The blocking units of the pattern may be formed by being engraved using at least one of a stamping method, a sputtering method, and a laser method.

The blocking units of the pattern may be formed of a polymer material containing carbon.

A cover member of an electronic device according to various embodiments disclosed herein may include: a first surface facing a printed circuit board; a second surface opposite to the first surface; a first region substantially facing a light emitting unit for generating light; a second region substantially facing a light receiving unit that converts light into an electrical signal; and a pattern formed in at least one of the first region and the second region of at least one of the first surface and the second surface and formed by repeatedly arranging blocking units having low optical transmittance at a predetermined interval.

The blocking units of the pattern may have a height of 20 um to 100 um and a width of 10 um to 30 um, and an interval therebetween may be 20 um to 100 um.

The pattern may have a shape of concentric circles sharing a center of the cover member and having different diameters.

The pattern may have a shape formed by radiation from a center of the cover member to an outer periphery of the cover member.

The second surface may have high flatness so as to be in close contact with a user's skin.

At least one of an anti-reflection material and an anti-scratch material may be disposed on the second surface to increase optical transmittance thereof.

The blocking units of the pattern may be formed by forming intaglios on at least one of the first surface and the second surface and portions of the intaglios with a material having low optical transmittance.

While the disclosure has been shown and described with reference to various embodiments thereof, it will be understood by those skilled in the art that various changes in form and details may be made therein without departing from the spirit and the scope of the disclosure as defined by the appended claims and their equivalents.

What is claimed is:

1. An electronic device comprising:
a printed circuit board;
a light emitting unit and a light receiving unit which are disposed on the printed circuit board;
a cover member which has at least a partial region configured by a material having high optical transmittance, wherein the cover member is disposed to face the printed circuit board, and comprises a first region substantially facing the light emitting unit and a second region substantially facing the light receiving unit; and
a pattern disposed in at least one of the first region and the second region of the cover member,
wherein at least a portion of the pattern is configured by a first material having low optical transmittance, and
wherein the pattern is disposed by repeatedly arranging blocking units having the low optical transmittance at a predetermined interval.

2. The electronic device of claim 1,
wherein the blocking units of the pattern have a height of 20 um to 100 um and a width of 10 um to 30 um, and
wherein the blocking units of the pattern are arranged at an interval of 20 um to 100 um.

3. The electronic device of claim 1,
wherein the pattern has a shape of concentric circles sharing a center of the cover member, and
wherein the concentric circles have different diameters.

4. The electronic device of claim 1, wherein the pattern has a shape configured by radiation from a center of the cover member to an outer periphery of the cover member.

5. The electronic device of claim 1, wherein a plurality of light receiving units are provided to be arranged along an outer periphery of the light emitting unit.

6. The electronic device of claim 1,
wherein the cover member comprises a first surface facing the printed circuit board, and a second surface opposite to the first surface, and
wherein the pattern is disposed on at least one of the first surface and the second surface of the printed circuit board.

7. The electronic device of claim 6, wherein the second surface of the cover member has high flatness so as to be in close contact with a user's skin.

8. The electronic device of claim 7, wherein at least one of an anti-reflection material and an anti-scratch material is disposed on the second surface of the cover member to increase optical transmittance thereof.

9. The electronic device of claim 6,
wherein the cover member comprises a third region other than the first region and the second region,
wherein a second material having low optical transmittance is disposed on the third region.

10. The electronic device of claim 9, wherein an electrode having low optical transmittance is disposed in at least one region of the third region on the second surface of the cover member.

11. The electronic device of claim 1, wherein the blocking units of the pattern are disposed by configuring intaglios on a surface of the cover member and filling portions of the intaglios with the first material having low optical transmittance.

12. The electronic device of claim 11, wherein the blocking units of the pattern are disposed by being engraved using at least one of a stamping scheme, a sputtering scheme, and a laser scheme.

13. The electronic device of claim 11, wherein the blocking units of the pattern are disposed by using a polymer material containing carbon.

14. A cover member of an electronic device, the cover member comprising:
a first surface facing a printed circuit board;
a second surface opposite to the first surface;
a first region substantially facing a light emitting unit configured to generate light;
a second region substantially facing a light receiving unit configured to convert light into an electrical signal; and
a pattern disposed in at least one of the first region and the second region of at least one of the first surface and the second surface by repeatedly arranging blocking units having low optical transmittance at a predetermined interval.

15. The cover member of claim 14,
wherein the pattern has a shape of concentric circles sharing a center of the cover member, and
wherein the concentric circles have different diameters.

16. The cover member of claim 14, where the pattern has a shape configured by radiation from a center of the cover member to an outer periphery of the cover member.

17. The cover member of claim 14, wherein the second surface has high flatness so as to be in close contact with a user's skin.

18. The cover member of claim 17, wherein at least one of an anti-reflection material and an anti-scratch material is disposed on the second surface to increase optical transmittance thereof.

19. The cover member of claim 14, wherein the blocking units of the pattern are disposed by configuring intaglios on at least one of the first surface and the second surface and filling portions of the intaglios with a material having low optical transmittance.

20. The cover member of claim 14,
wherein the blocking units of the pattern have a height of 20 um to 100 um and a width of 10 um to 30 um, and
wherein the blocking units of the pattern are arranged at an interval of 20 um to 100 um.

* * * * *